United States Patent [19]

Rendulic et al.

[11] 4,436,806
[45] Mar. 13, 1984

[54] METHOD AND APPARATUS FOR MAKING PRINTED CIRCUIT BOARDS

[75] Inventors: Francis J. Rendulic, Sudbury; Robert K. Trasavage, Whitinsville, both of Mass.; Paul A. Boduch, Lakewood, Colo.

[73] Assignee: W. R. Grace & Co., Cambridge, Mass.

[21] Appl. No.: 350,777

[22] Filed: Feb. 22, 1982

Related U.S. Application Data

[63] Continuation-in-part of Ser. No. 225,810, Jan. 16, 1981, abandoned.

[51] Int. Cl.$^3$ .............................................. G03C 5/00
[52] U.S. Cl. .................................... 430/311; 430/313; 430/314; 430/281; 430/284; 430/906; 430/319; 430/329
[58] Field of Search ............... 430/313, 314, 318, 281, 430/284, 286, 906, 319, 329, 311

[56] References Cited

U.S. PATENT DOCUMENTS

| | | | |
|---|---|---|---|
| 3,660,088 | 5/1972 | Lundsager | 430/323 |
| 3,713,864 | 1/1973 | Ackerman et al. | 117/38 |
| 3,715,293 | 2/1973 | Sandner et al. | 204/159 |
| 3,801,329 | 4/1974 | Sandner et al. | 430/281 |
| 3,809,732 | 5/1974 | Chandross et al. | 264/22 |
| 3,850,770 | 11/1974 | Jusa et al. | 204/159 |
| 3,890,150 | 6/1975 | Hasegawa et al. | 430/283 |
| 3,953,214 | 4/1976 | Lipson et al. | 430/281 |
| 3,954,584 | 5/1976 | Miyata et al. | 204/159 |
| 4,038,078 | 7/1977 | Sakurai et al. | 430/325 |
| 4,162,274 | 7/1979 | Rosenkranz et al. | 528/75 |
| 4,164,486 | 8/1979 | Kudo et al. | 206/22 |
| 4,167,415 | 9/1979 | Higuchi et al. | 430/286 |
| 4,170,481 | 10/1979 | Akama et al. | 430/288 |
| 4,218,295 | 8/1980 | Lee | 204/159.23 |
| 4,228,232 | 10/1980 | Rousseau | 430/271 |

FOREIGN PATENT DOCUMENTS

| | | |
|---|---|---|
| 1289075 | 9/1972 | United Kingdom . |
| 1489425 | 10/1977 | United Kingdom . |
| 1507808 | 4/1978 | United Kingdom . |
| 1519013 | 7/1978 | United Kingdom . |
| 2002531 | 2/1979 | United Kingdom . |
| 2034492 | 6/1980 | United Kingdom . |
| 2070634 | 9/1981 | United Kingdom . |

OTHER PUBLICATIONS

Richter et al., Circuits Manufacturing, vol. 19, No. 11, pp. 69 and 117–119, Nov. 1979.

R. M. Kossoff & Associates, Inc., Photopolymer Resists: A Multiclient Study, Feb. 1975, p. E-1-E-24.

Sorrentino, "Photographic Imaging of UV Liquid Photoresists-A New Process," Conf. Proc. of PC 1981, 4th Annual Int. Printed Circuits Conference, New York, Jun. 1981, pp. 1–6.

Primary Examiner—John E. Kittle
Assistant Examiner—Jose G. Dees
Attorney, Agent, or Firm—Carole F. Barrett; William L. Baker; Michael J. McGreal

[57] ABSTRACT

Printed circuit boards are made by imaging a liquid polymer which has been coated onto the board. The imaging is accomplished while the polymer is wet with the photo tool in a close air gap relationship with the coated board. The uncured polymer which remains liquid is removed after imaging so that the board can be processed by etch resist, plate resist, or solder mask techniques. The cured polymer is removed by stripping with an alkaline solution. The apparatus consists of single station or multi-station equipment to carry out the unit operations of maintaining the board in a set position, coating with a liquid polymer, placing a photo tool in registration with the circuit board blank and in close relationship with the coating, and imaging the liquid polymer via the photo tool to cause areas of the coating to solidify and other areas to remain liquid.

38 Claims, 15 Drawing Figures

FIG. 1

| COAT A BLANK METAL CLAD SUBSTRATE WITH LIQUID POLYMER |

| PLACE A PHOTO TOOL HAVING CIRCUIT DESIGN ABOVE LIQUID COATING |

| APPLY COLLIMATED LIGHT TO THE PHOTO TOOL |

| REMOVE LIQUID POLYMER WHICH HAS NOT BEEN CURED |

| REMOVE EXPOSED METAL BY ETCHING |

| REMOVE CURED LIQUID POLYMER |

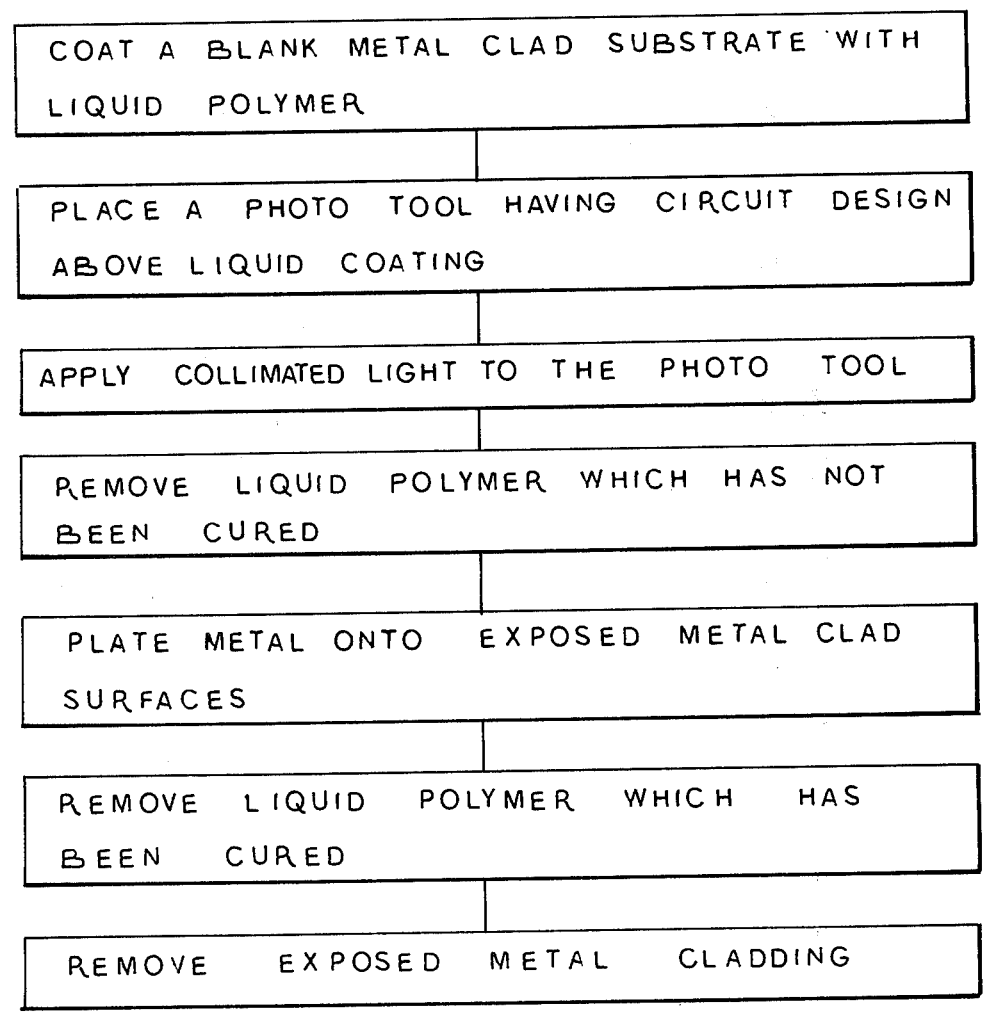

FIG. 3

```
┌─────────────────────────────────────────────┐
│ COAT A PRINTED CIRCUIT BOARD                │
│ WITH LIQUID POLYMER                         │
└─────────────────────────────────────────────┘
                      │
┌─────────────────────────────────────────────┐
│ PLACE A PHOTO TOOL HAVING A                 │
│ SOLDER MASK DESIGN ABOVE THE                │
│ LIQUID COATING                              │
└─────────────────────────────────────────────┘
                      │
┌─────────────────────────────────────────────┐
│ APPLY COLLIMATED LIGHT TO THE               │
│ PHOTO TOOL                                  │
└─────────────────────────────────────────────┘
                      │
┌─────────────────────────────────────────────┐
│ REMOVE LIQUID POLYMER HAS NOT               │
│ BEEN CURED                                  │
└─────────────────────────────────────────────┘
                      │
┌─────────────────────────────────────────────┐
│ COAT EXPOSED METAL AREAS                    │
│ WITH SOLDER                                 │
└─────────────────────────────────────────────┘
```

METHOD AND APPARATUS FOR MAKING PRINTED CIRCUIT BOARDS

This is a continuation-in-part of application Ser. No. 225,810, filed Jan. 16, 1981, now abandoned.

This invention relates to new processes and equipment for making printed circuit boards. More particularly, this invention relates to photoresist processes and related equipment which utilize liquid polymer compositions curable by the application of non-coherent collimated light.

There are various ways to apply an image to the surface of a metal clad board when making printed circuit boards. These fall into the four broad categories of wet film techniques, dry film techniques, hand screening, and machine screening. The wet film imaging techniques generally consist of applying a photoresist composition in a liquid state to a circuit board blank, drying the film and imaging it. The dry film techniques consist of laminating a dry photoresist composition onto the circuit board blank and imaging it. The hand screening and machine screening consist of the use of conventional screen printing techniques for applying a resist composition in a particular design onto the copper surface of the blank board. Hand screening is used when a limited number of boards are required.

The techniques of the present invention fall into the wet film category, but differ from the prior wet film techniques in that the film is not dried prior to exposing the film to the light source which induces a change in the part of the film which is exposed. That is, although the various prior art techniques coated the circuit board blank with a liquid, this film was usually dried prior to the subsequent steps. This drying of the film to harden is considered a requirement since the medium for applying a circuit design to a blank board (usually called a photo tool) is placed in contact with this coating. It has been considered necessary to place the photo tool in contact with the coating in order to get good definition in the final printed circuit. Also, the present processes do not require any complex developing agents or techniques and after imaging all that is necessary is that the uncured liquid polymer be removed.

Broadly, it has been discovered that liquid polymeric coatings on printed circuit board blanks can be imaged while undried and yet get very good definition. This is the case even though an air gap must be maintained between the photo tool which bears the printed circuit design image and the liquid polymeric coating. This coating can range from an easily flowable liquid to a tacky viscous liquid. During imaging, light from the non-coherent collimated light source passes through the transparent areas of the photo tool, strikes the liquid polymer, and cures the liquid polymer to a solid. Where no light passes through the photo tool, the liquid polymer remains liquid, and is removed from the printed circuit board blank to expose the underlying metal. Although the liquid polymer can be removed by physical techniques such as an air knife or by wiping, it is most effective to remove the liquid polymer by means of a liquid in which the liquid polymer is at least partially soluble, but in which the cured solid polymer has essentially no solubility. The primary advantage is that such a technique fully exposes the metal underlying the liquid polymer thereby permitting a more effective etching of this metal in a subsequent step.

As discussed above, one of the drawbacks of imaging a liquid coating is the necessity of an air gap between the photo tool and the liquid coating. The use of an air gap usually results in a loss of definition in the printed circuit. However, in the present processes this is not a problem. This is at least in part the result of the use of a non-coherent collimated light beam for imaging, the processing techniques for removal of the uncured liquid polymer, the good adhesion of the cured polymer to the underlying metal, the resistance of the cured liquid polymer to etching solutions, and the ease of removal of the cured liquid polymer after etching. That is, the solution which is used to remove the uncured liquid polymer to expose the underlying metal does not attack the cured polymer. If the cured polymer is also attacked, there will be a loss in definition in the final circuit and a possible loss of adhesion of the cured polymer to the underlying metal. Any loss of adhesion would cause excess metal to be removed during the etching step. However, when a solution containing cations derived from a strong base contacts the cured polymer, it is effective in removing the cured liquid polymer without attacking the underlying metal. The net result is that no organic containing solutions are required in processing the imaged printed circuit board. This provides for significant cost savings since organics are more expensive, are fire hazards, and create fumes and odors which under state and federal regulations would have to be removed from the work area. It is, therefore, very useful to be able to use aqueous solutions in the commercial production of the circuit boards.

The term "non-coherent collimated light" means light having a half angle of not more than 3 degrees, and preferably not more than 1.5 degrees. By contrast, laser light is coherent light. Light is collimated (formed into a beam) by lenses, parabolic reflectors or various arrangements of mirrors.

In brief summary, the present invention consists of new etch and plate resist processes to produce printed circuit boards using liquid polymers, a new process to make solder masks using liquid polymers, and single station and multistation equipment to perform these processes. Each of these processes images circuit board blanks which have a liquid polymer coating and each only requires aqueous solutions to process the board after imaging. As a result the same equipment can be used to plate resist, etch resist and solder mask. This versatility provides many cost advantages, and particularly to lower volume producers of the various types of printed circuit boards.

In the etch and plate resist processes of the present invention, the circuit board blank is first coated with the liquid polymer. A photo tool of the desired circuit is then placed in registration above, but not in contact with the liquid polymer coating. The blank is then imaged whereby under the transparent areas of the photo tool the polymer cures to a solid, while that under the opaque areas remains liquid. This liquid polymer is then removed, preferably by use of solution in which it is at least partially soluble. After this step the processes for making plate resists and etch resists differ. In making etch resists, the exposed metal is etched away using an aqueous acid solution and the cured liquid polymer then removed using an alkaline solution containing cations derived from a strong base. In making plate resists, tin, nickel and/or similar metals are plated on the exposed metal after liquid polymer removal, the cured liquid polymer removed using an alkaline solution containing cations derived from a strong base, and the metal layer which has been exposed removed by etching.

Solder masks are produced by coating a printed circuit board with a liquid polymer, imaging the coated board to create cured polymer on certain parts of the circuit design, while leaving the polymer uncured on other parts. The uncured liquid polymer is then removed using a solution in which it is at least partially soluble and the exposed metal coated with solder. The cured polymer is usually not removed, but left on the board as an insulating layer.

The single station equipment found very useful in practicing these processes consists of a device for holding a printed circuit board or printed circuit board blank in a set position, a retractable roller coater for coating one side of a board, a photo tool in registration with the circuit board blank and bearing an image of a circuit and which can be retractably moved to a point above, but in close proximity to, the coated board, and a non-coherent collimated light source positioned for passing light through the photo tool to cure liquid polymer. Various arrangements for these units are possible. However, the preferred arrangement is to have the board blank held in place by means of a vacuum with a roller coater horizontally retractable to coat the board. The photo tool assembly is vertically retractable and is located above the positioned circuit board blank and in the path of the non-coherent collimated light from the light source. Therefore, in operation the machine operator positions the board and activates the vacuum holding means. Thereafter, stepwise, the roller coater is activated and passes over the board, coats the board and retracts. Following this step the photo tool assembly lowers into close relationship with the coating, and when in position the lights source is activated for a time period to cure the polymer. When the light goes off, the photo tool assembly retracts upwardly and the board moves on a conveyor to a spray bath for removal of the uncured liquid polymer. The equipment for the subsequent steps consists of a state-of-the-art etching, metal plating and solder depositing devices. The multistation equipment consists of separate coating and exposing units, but otherwise is similar to the single station equipment.

The present processes and equipment will be discussed in more detail with reference to the following drawings:

FIG. 1 is a stepwise diagram of the etch resist process for making printed circuit boards.

FIG. 2 is a stepwise diagram of the plate resist process for making printed circuit boards.

FIG. 3 is a stepwise diagram of the process for making solder masks.

FIG. 11 is a front elevational view of the multi-station apparatus to stepwise perform the operations of the apparatus of FIGS. 8 and 10.

Figure 4:
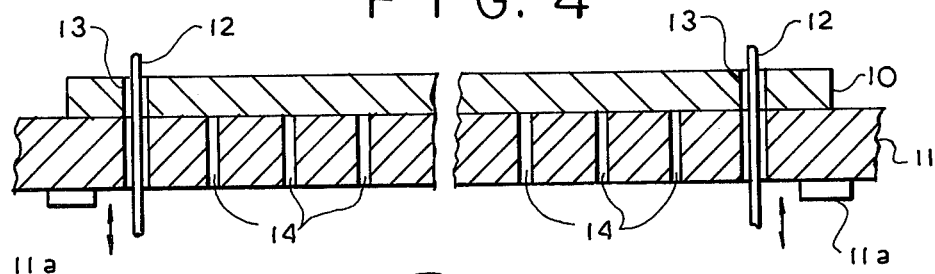
FIG. 4 is an elevational view of a circuit board blank positioned on a vacuum holding plate.

FIG. 1 sets out the steps for producing a printed circuit board using etch resist techniques. The process starts with an electroconductive clad blank. Such blanks consist of a non-metallic substrate, usually a plastic containing reinforcing fibers, having on one or both sides a metal layer with a thickness of about 0.001 to 0.003 inches. The substrate can be of any reasonable thickness, but is usually about 0.003 to 0.25 inches thick. Commonly, these substrates are phenolic or epoxy plastics reinforced with fiberglass or an equivalent material. The metal cladding is usually copper.

In making an etch resist according to the present process, the metal clad blank is coated on one side with liquid polymer to a thickness of about 0.1 to 10 mils or more. Preferably the coating thickness is uniform over the entire blank, and in a thickness of about 0.5 to 5 mils. The coating has to be sufficiently thick to insure that there are no voids, but not so thick that the liquid polymer flows off the edge of the blank or through the many small holes which traverse the blank. Coating can be by any convenient technique, such as spraying, brushing, or roller coating. However, roller coating is preferred since it deposits a more uniform wet polymer film on the board, and it has unexpectedly been found that in roller coating the liquid polymer tends not to flow into any of the holes through the blank even though a vacuum is being drawn on the underside of the board. This is primarily attributable to an interplay between this mode of application and the surface tension of liquid polymers. These holes are used later in connecting circuit components to the finished boards. If polymer flowed into these holes, it would have to be removed before circuit assembly.

In the next step, a photo tool which bears the circuit design is placed in an air gap relationship with the liquid polymer coating. It is desirable to have the photo tool as close as possible, but not contacting the liquid polymer coating. An air gap of about 5 to 500 mils is generally used. An assembly holds the photo tool in position and in registration with the polymer coated blank. In the preferred method, the photo tool is held in position by means of a metal frame and a vacuum drawn on the edge of the photo tool. When the photo tool is an emulsion on a glass plate, the glass plate is mechanically held in place. In the instances where the photo tool is an emulsion on a plastic film, such as a polyester film of about 4 to 10 mils thick, a glass plate is above the film to assure that the film is maintained in the same plane. Regardless of whether an emulsion on a glass plate or a plastic film is used as the photo tool, the emulsion side is what is in air gap relationship with the liquid polymer coating.

The term "photo tool" is broadly used to mean any image bearing medium and can be any silver or silverless emulsion. This includes diazo emulsions. This emulsion can be supported on a polymer film, glass, or any other convenient medium. The term "registration" is used to denote the placement of the photo tool over the circuit board blank in a manner so that the desired circuit is placed on predetermined areas of the blank.

After the photo tool is in place, a non-coherent collimated light source, which is preferably a source of 2000 to 5000 Angstrom radiation and which is located to pass light through the photo tool, is activated. Convenient light sources include carbon arcs, mercury arcs, mercury zenon lamps, tungsten halide lamps, and argon glow lamps. Preferably the light source is a mercury arc or mercury zenon light beam. The light passes through the transparent areas of the photo tool, strikes the liquid polymer and cures the liquid polymer to a solid. The liquid polymer which is not contacted by any light remains liquid. A time duration of about 5 to 120 seconds is usually sufficient to cure the liquid polymer. However, where necessary, longer time durations can be used.

After the liquid polymer is solidified where contacted with light, the uncured liquid polymer which has remained liquid, is removed to expose the underlying metal. This can be accomplished using an air knife to blow the liquid polymer from the surface, by wiping or by using a liquid in which the liquid polymer is at least partially soluble. The preferred technique is to use an aqueous alkaline solution in which the liquid polymer is at least partially soluble. Suitable solutions are alkaline solutions containing sodium, potassium, or ammonium ions such as sodium hydroxide, sodium carbonate, sodium bicarbonate, sodium sulfite, sodium bisulfite, potassium hydroxide, potassium carbonate, potassium bicarbonate, potassium sulfite, potassium bisulfite, ammonium hydroxide, ammonium carbonate, and combinations of these materials. Alkaline detergents or even organic-aqueous mixtures can also be used so long as they do not attack the cured polymer.

Subsequent to the removal of the uncured liquid polymer, the exposed metal is removed by etching. Usually this metal is copper and the etching solution can be any commonly used copper etchant, such as an acidic chloride solution. Commonly used copper etchant solutions are ferric chloride or hydrochloric acid solutions which may also contain some other components. After the completion of this step, there remains the blank with the metal layer now only present under the cured liquid polymer.

The last step comprises removing the cured liquid polymer. This is accomplished by contacting the cured liquid polymer with an alkaline solution containing cations derived from a strong base. Sodium or potassium containing compounds are preferred alkaline materials for making such solutions. However, other reagents which will yield strongly basic cations can also be used.

FIG. 2 sets out the steps in producing a printed circuit board using plate resist techniques. The first four steps in plate resist processing are essentially the same as those for etch resist processing. As a result after the step of removing the uncured liquid polymer, the exposed metal is in a pattern identical to that of the final circuit design. The remainder of the metal is covered by the cured polymer.

The next step in producing a plate resist consists of plating tin, lead, nickel, or combinations of these metals onto the exposed metal. This is conveniently done by electroless or electroplating onto the exposed metal. The cured polymer is removed in the same manner as in the etch resist techniques. That is, the board is washed with an alkaline solution containing cations derived from a strong base.

The final step in making the plate resist consists of etching away the metal, usually copper, which has been exposed upon removal of the cured polymer. This etching is the same as for etch resists with the plating metal protecting the underlying metal. The final product is a printed circuit board with a circuit design coated with the plated metal.

FIG. 3 sets out the steps for applying solder masks to printed circuit boards. In producing a solder mask, the starting substrate is a completed printed circuit board. In the first step the printed circuit board is coated with the liquid polymer using any of the techniques as disclosed in the FIG. 1 etch resist processing. A photo tool which has opaque areas above the areas where solder is to be deposited, is then placed in exacting registration above the coated printed circuit board and the light source activated. The liquid polymer cures to a solid in all areas contacted by the light with all other areas remaining liquid. The uncured liquid polymer is then removed in the same manner as etch resist processing. The exposed metal areas are contacted with solder which remains on the exposed metal. Wave soldering methods can be conveniently used. The solder in these selected areas is then used to connect various electronic components and wires.

These are the three primary processes for utilizing the present liquid polymer processes in printed circuit board manufacturing. FIGS. 4 through 7 broadly illustrate the preferred mechanisms used in accomplishing these steps through the curing of the liquid polymer. In FIG. 4, the printed circuit board blank 10 is positioned on platen 11, by means of guide and registration pins 12 which pass through holes 13 in the circuit board blank. This platen has a series of small holes 14 drilled through the platen. A vacuum is drawn on the underside of this platen to a degree sufficient to keep the board locked in position on the platen surface. The pins 12 are then retracted below the board surface.

Figure 5:
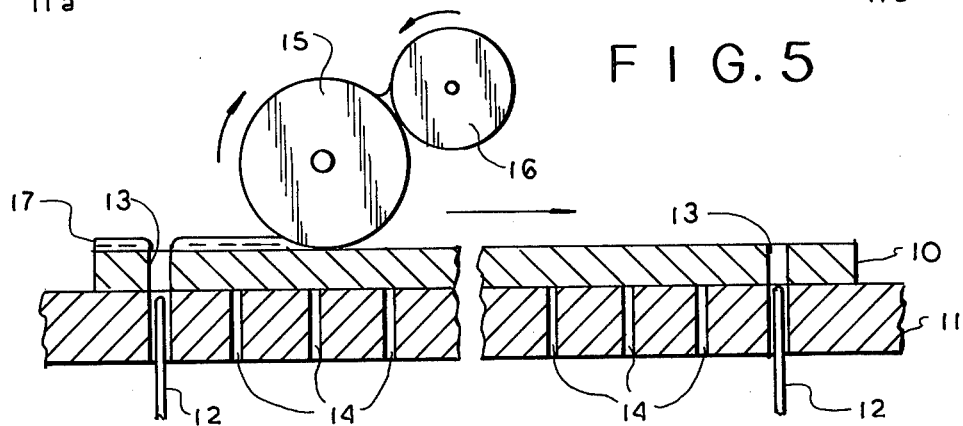
FIG. 5 is an elevational view of the circuit board blank being coated by a retractable roller coater.

Now that the printed circuit board blank is locked in position, FIG. 5 illustrates the coating with liquid polymer. The retractable roller coater consists of application roller 15 and doctor roller 16. A supply of liquid polymer remains at the nip of the rollers. Each roller is at least as long as the width of the circuit board blanks. The doctor roller allows a predetermined amount of liquid polymer to be picked up by the application roller. This predetermined feed regulates the thickness of the liquid polymer 17 on the blank. After coating, the roller coater retracts.

Figure 6:
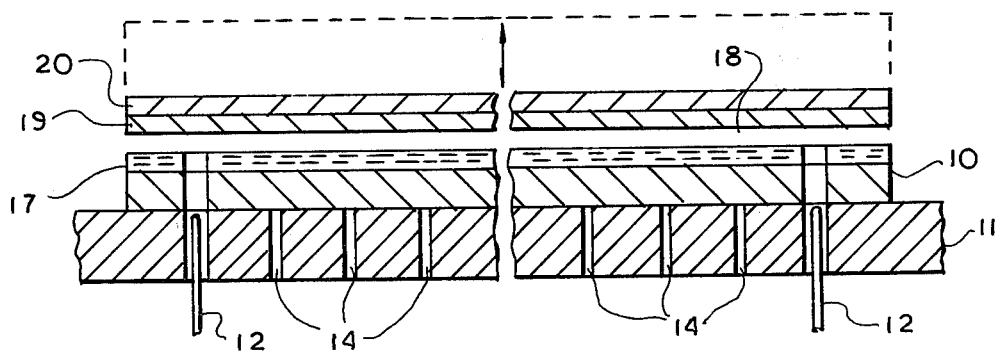
FIG. 6 is an elevational view of the photo tool lowered into a close relationship with the coated circuit board blank.
Figure 7:
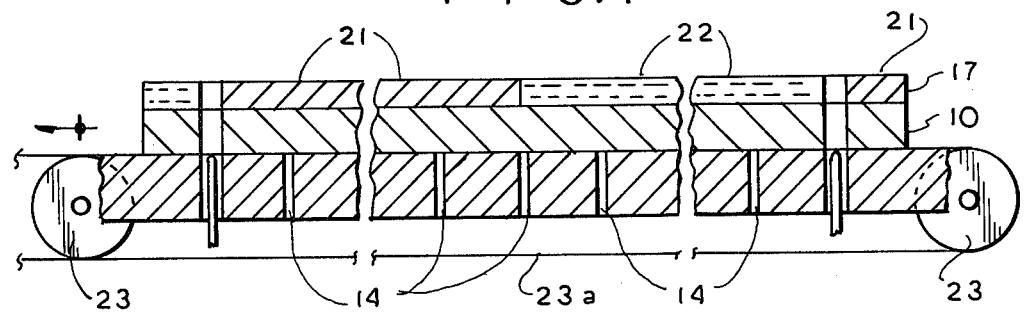
FIG. 7 is an elevational view of circuit board blank with the photo tool retracted showing certain area of cured liquid polymer.

FIG. 6 shows the liquid polymer board blank with the photo tool in place. Here the blank 10 is fully coated with a layer 17 of liquid polymer. Air gap 18, which is in the range of 5 to 500 mils, separates the liquid polymer from the photo tool. The photo tool assembly is comprised of negative 19 and planar maintaining glass plate 20. The negative is directly above air gap 18 and preferably the emulsion side of the film is adjacent the air gap. With the photo tool in place, a light source above the photo tool is activated. Where light strikes the liquid polymer, it cures to a solid. This is illustrated in FIG. 7, where 21 designates cured solid polymer areas, while 22 designates the uncured liquid polymer areas. The board is now ready for removal of the uncured polymer. The board can conveniently be conveyed from the platen by means of a series of rollers 23 which carry conveyor belts 23(a) for transport of the board. Conveyor belts 23(a) are inset into the platen and raised when the board is to be transported.

The non-coherent collimated light which is used for these processes is defined as the light angle where the light strikes the photoresist. This angle should preferably be a light a half angle of not more than 3 degrees and preferably not more than 1.5 degrees. This light will produce a photoresist which has an angle of deviation from vertical of not more than ±3 degrees and preferably not more than 1.5 degrees. A plus deviation designates a shoulder on the photoresist while a negative deviation designates an undercut. Also, this light should not have an image dimension deviation of more than ±½ mil and preferably not more than ±¼ mils. If the deviation from vertical or the image dimension deviation exceeds these amounts, there will result a lack of accuracy and/or uniformity in the dimensions of the resulting circuit. This can result in a change in circuit resistance which can affect the overall performance of the final electronic item.

Figure 8:
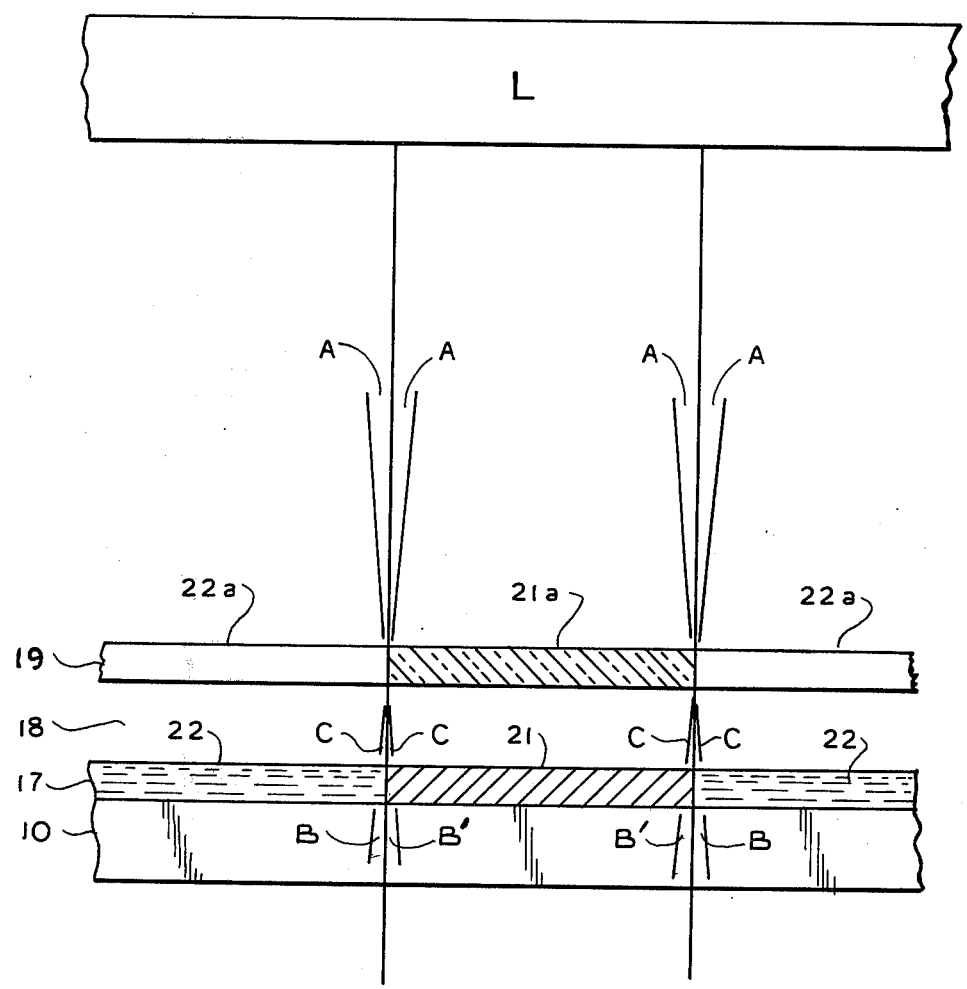
FIG. 8 is a schematic diagram illustrating the non-coherent collimated light which is used.

These factors which define this light are illustrated in detail in FIG. 8. In this figure, the incident light is designated as L. The photo tool is designated as 19, the circuit board as 10, the liquid polymer coating as 17, and the air gap between the photo tool and the liquid polymer as 18. Area 21(a) of the photo tool is a transparent area, while area 22(a) is an opaque area. After exposure to light, in area 21 the liquid polymer has solidified, while in area 22 it remains a liquid. The light strikes the photo tool in a substantially perpendicular condition. However, since this is an ideal condition, and since all non-coherent light will have some deviation, this is defined by means of the half angle A of the light. This half angle A will produce an angle of deviation in the photoresist resulting in either a shoulder B or an undercut B' in the photoresist. The angle of deviation in the photoresist which is the angle of the shoulder or of the undercut is the angle by which the vertical side of the photoresist deviates from absolute vertical.

The dimension deviation factor is also illustrated with reference to FIG. 8. This factor is the maximum amount of deviation of the photoresist from the dimension of the circuit line on the photo tool. The light, itself, or the light striking the edge of the opaque area on the photo tool, cannot be deflected or otherwise affected to an extent where the dimension of the polymerized polymer 21 will differ from the dimension of the opaque area 21(a) on the photo tool 13 by not more than ±½ mil and preferably not more than ±¼ mil. The objective is to have the width dimensions of area 21 to as much as possible be identical to that of area 21(a). This is shown by angle C.

This light should have a substantial amount of its energy in the ultraviolet and visible bands, that is, in the region of 2000 to 5000 angstroms. Also, this light should have an intensity of about 4 to 30 mille watts/cm² at the surface of the liquid polymer. This is not a critical feature since at lower intensites, a longer exposure time can be used to achieve the same result. A light source of this kind is at times designated as an actinic light source.

The other parameter of importance with regard to the light source is its placement with regard to the object which is to receive the light energy. The collimated light should be in a plane which is parallel to the plane of the object which is to receive the light energy. Thus, the collimated light which is emitted perpendicular to the plane of light will be received perpendicular to the plane of the object which is receiving the light. This insures that the end circuit and the circuit design on the photo tool are identical. If this orientation is not maintained, the circuit lines will be offset from that of the photo tool. This will create problems where a board is to carry a different circuit on each side.

Figure 9:
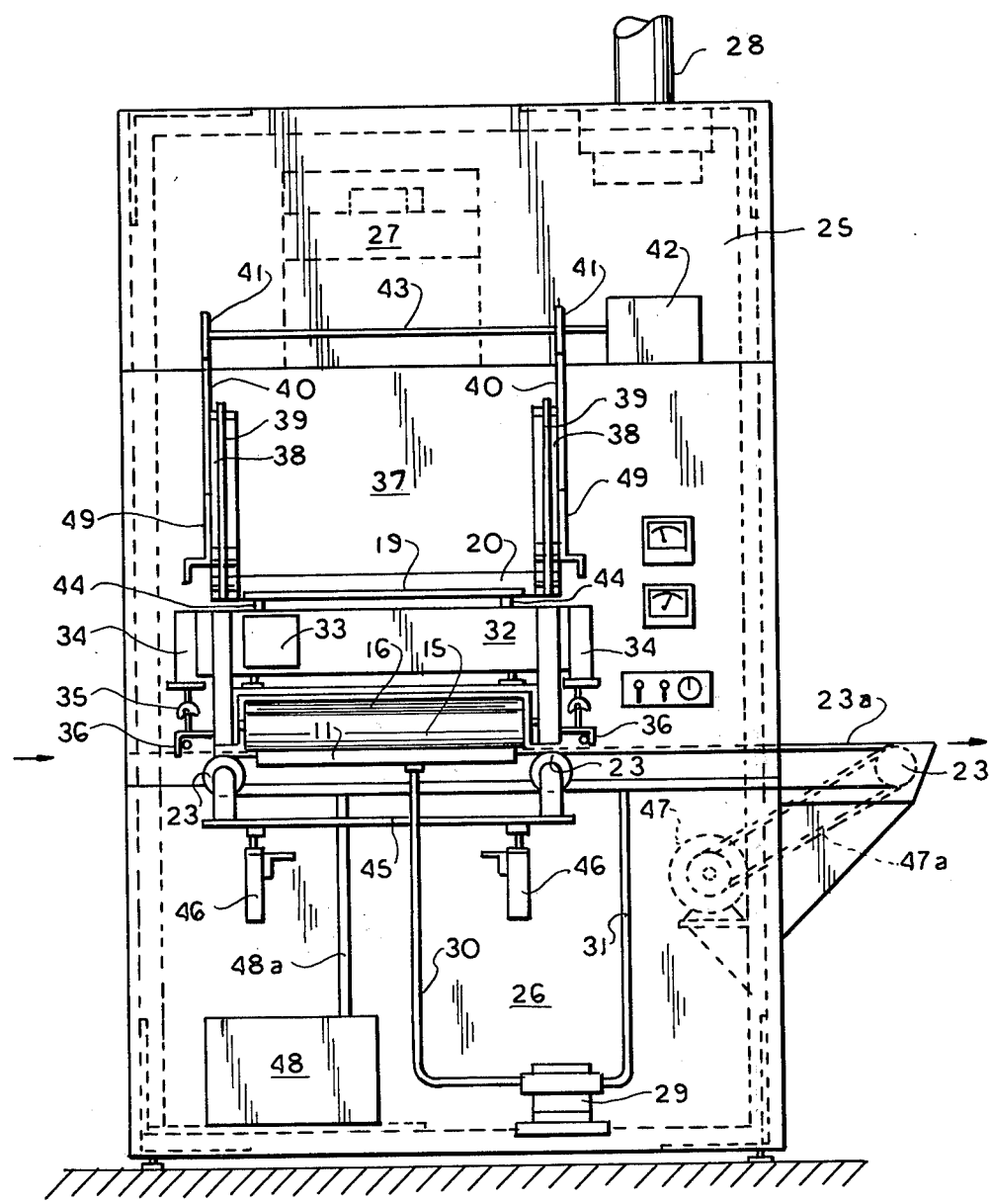
FIG. 9 is a front elevational view of a single station apparatus which contains the components of FIGS. 4 and 7.
Figure 10:
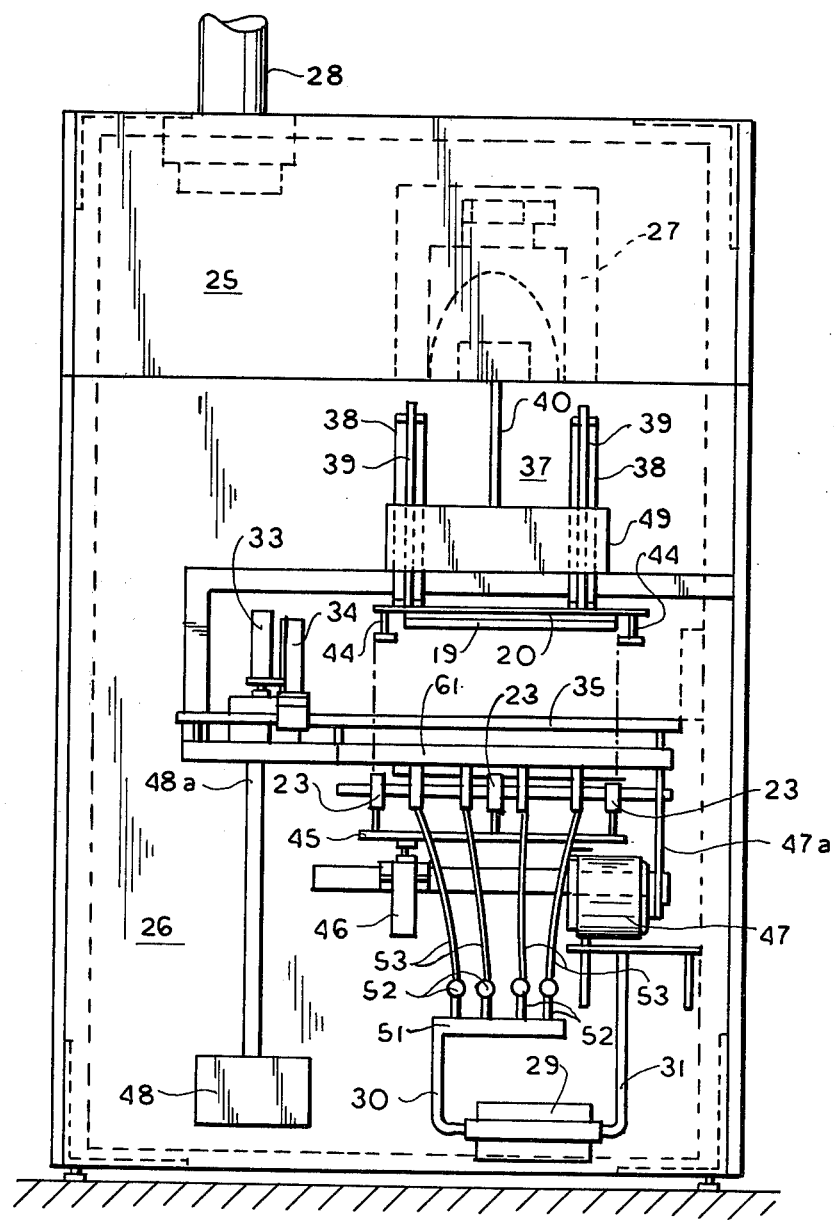
FIG. 10 is a side view of the single station apparatus of FIG. 8.

FIGS. 9 and 10 illustrate single station equipment which incorporates all of the unit operations of FIGS. 4 through 7. By single station is meant that each of the steps of FIGS. 4–7 are carried out at the same area. The preferred arrangement of the individual units is shown in each figure. The upper part of the cabinet houses light source 27 and has a vent 28 for venting heat and fumes from the apparatus. The light source is a mercury arc or mercury zenon lamp, is stationary and, thus, can be mounted in any manner which assures rigidity. The lower section 26 of the cabinet houses the vacuum pump 29 and interconnecting tubing 30 and 31, the motor 47 which drives the conveyor system for removing imaged boards to the uncured polymer removal station, and polymer pump and storage tank 48 with delivery tubing 48(a). The middle area of the cabinet is at the operator working level and contains the particular equipment for the unit operations as shown in FIGS. 4 through 7.

In place of a light source mounted in the upper part of the cabinet 25, the light source can be located in the lower part of the cabinet with a series of mirrors in the upper part of the cabinet. These mirrors are positioned to change the path of the light so that it will pass down through the photo tool. This can be accomplished by the use of two angled mirrors which will each reflect the light perpendicularly so that the direction of the light beam changes from an upward direction to a downward direction and through the photo tool.

In more detail, after a circuit board blank is placed in the machine and positioned on the retractable pins (as shown in detail in FIGS. 4 and 5), a vacuum is drawn on the underside of platen 11 by means of vacuum pump 29 and interconnecting tubing 30. In this view, the roller coater is shown in the position it is in when applying liquid polymer to a circuit board blank. The roller coater application roller 15 and doctor roller 16 are mounted on bracket 32. The application roller is mounted forward of the doctor roller. Each roller turns in a compatable manner as shown in FIG. 5. The area between the rollers receives liquid polymer from pump and tank 48 by means of tubing 48(a). An electronic sensing mechanism maintains a constant level of liquid polymer in the nip of the rolls by switching the liquid polymer pump or actuating a valve to flow the polymer back to the tank. Drive mechanism 33 operates the rollers. This drive mechanism is mounted on the moving carriage and is an electric motor with chain or gear drive to each roller. Drive mechanism 34 moves the roller coater mechanism forwardly and rearwardly on fixed screw tracks 35. This drive mechanism 34 consists of a stationary reversible electric motor which is connected to each rotating screw by means of a chain drive. That is, the motor shaft and each screw has a sprocket and the chain rides over each sprocket. Preferably a spring-loaded idler sprocket is used to tension the screw drive chain. These screw tracks can both support the coater and move it forward and backward in each coating cycle. However, it is preferred to use a separate bearing way 36 to support the roller coater. The roller 15 is usually in contact with the blank only on the forward or the rearward pass over the blank. It can, however, be in contact with the blank on both passes. When coating in the forward direction, the application roller 15, due to the positioning of the doctor roller 16 (behind roller 15), will deposit a thicker film. In the forward direction, this coating can range from about 3 to 10 mils, while in reverse coating, the coating will be thinner and range from 0.5 to 5 mils. Depending on the thickness of the coating desired, the application roller is maintained in contact or is raised out of contact with the blank on the forward or reverse pass over the blank. Solenoids are used to raise the rollers on the forward or rearward pass as desired. The coating time ranges from 4 to 20 seconds, with about 8 seconds found to be convenient. The rotating screw mechanism which moves the roller coater, can be operated at various speeds since it uses a separate reversible electric motor from that which controls the rollers. This coating speed can be changed as the need arises.

The application roller is constructed of polyenes and preferably is grooved. These materials are stable and not significantly affected by the liquid polymer. This roller is of a length to coat the largest circuit board blank which can be held on the platen and is in the range of about 2 to 6 inches in diameter. The doctor roller can be of any material not affected by the liquid polymer and is conveniently stainless steel or chrome plated steel. The diameter of this roller is less than that of the application roller. The degree of clearance between the application roller and the platen which holds the blank is set by adjusting two micrometers which raise and lower the rollers but do not raise or lower the screw mechanism for moving the roller assembly over the blank.

Depicted above the roller coater mechanism is the photo tool assembly 37. The photo tool assembly contains the film 19 which is held in planar alignment by glass plate 20. The lower side of the film is the emulsion side of the film and carries the image of the circuit design. The photo tool assembly is retractably mounted by means of guide bracket 38 and bearing way 39, so that it can be raised to an upper part of the cabinet when the roller coater is in a forward position applying liquid polymer, and then lowered so as to put the photo tool in close air gap relationship with the liquid polymer coating during imaging. The photo tool slideably moves upwardly and downwardly aligned by the bearing ways 39. Chains 40 attach to side brackets 49 of the photo tool assembly and extend upwardly over sprockets 41. These sprockets are rotated by reversible motor 42 via drive shaft 43. Rotating these sprockets raises and lowers the photo tool assembly about 12 inches. These sprockets need only have a circumference equal to about the distance that the photo tool assembly is to be raised and lowered. On the lower end of the photo tool assembly, there are adjustable pins 44 which are set so as to maintain the proper air gap between the photo tool and the coated surface. At least 4 of these pins are used. These pins contact the platen surface and support the photo tool assembly during imaging. Tubing 31 connects the photo tool assembly to the vacuum pump. The vacuum which is drawn on the photo tool holds it in place at its edges. Registration pins can also be used to help align the photo tool. Although the retracting mechanism has been discussed with respect to using a chain, or a cable, a rotating screw as used for the roller coater can be used. However, it is preferred to use a chain or cable elevator-type mechanism for raising and lowering the photo tool assembly.

Once the photo tool assembly is in place and resting on pins 44, the lamp 27 is activated which sends a beam of non-coherent collimated light down onto the photo tool. This light is applied for from 5 to 120 seconds, and preferably for about 20 seconds. As a light source ages and gets weaker, the light application time is extended. Light intensity can be measured manually and the time duration adjusted or an integrator can be used which automatically monitors the time intensity application of light energy and adjusts the light source. The light source is then extinguished and the photo tool assembly is raised upwardly to its rest position. The vacuum on platen is then released, conveyor mechanism 45 raised, and the board automatically removed from the apparatus for further processing. The conveyor is raised by activating solenoids 46 raising bracket 45 which in turn raises rollers 23 and the associated conveyor belt 23(a) in the area of the platen. Motor 47 is simultaneously activated with solenoids 46. Belt 47(a) from the motor drives rollers 23.

The equipment can be operated on a manual or automatic basis. In manual operation, the operator would control each step. However, an automatic operation is preferred, whereby after the circuit board is positioned, the steps are each sequentially performed without any operator control. Besides providing for better quality control, it permits safer operation of the equipment. The controls shown in FIG. 9 depicts some of those which are used for automatic operation. It would generally be desirable to have gauges to give a constant indication of vacuum in the platen and photo tool assemblies. Switches would include a Master On-Off switch, vacuum pump switch, and light timer device. These are all state-of-the-art items and still others could be added.

FIG. 10 shows a side view of the apparatus of FIG. 9 from the side opposite that where the circuit board blank exits, i.e., from the left side of the appartus of FIG. 9. The various parts are the same and bear the same numeral designations as in FIG. 8, except that this view shows the use of an optional multiple chamber platen assembly. The upper section 25 contains the light source 27 and vent 28. The lower section 26 which contains the vacuum pump 29, liquid polymer pump, and tank 48 associated polymer supply tubing 48(a), and motor 47 with associated belt 47(a) for driving conveyor rollers 23. The mid-section is the operator-working area, and contains the circuit board positioning mechanism, the roller coater mechanism, and the photo tool assembly. Each of these has been described with reference to FIG. 9, but will be described here again with reference to this FIG. 10.

The circuit board positioning mechanism consists of platen assembly 61 which has a series of holes 63 for drawing a vacuum on the upper side of the platen. The platen here is the multichamber platen assembly of FIGS. 13 and 14. That is, there are four separate chambers in the platen assembly. A vacuum can be drawn on any or all of these chambers. This platen is used when various sized circuit boards are to be produced. In use a vacuum is only drawn on the chamber or chambers over which there is positioned a circuit board blank.

In securing the circuit board blank, it is first determined as to the chambers in the platen on which a vacuum is to be drawn. Valves 52 with connect lines 53 to vacuum manifold 51 are then opened for the chambers on which a vacuum is to be drawn. The other valves 52 remain closed. After the circuit board is firmly in position, the roller coater is activated so that it moves forward on screws 35 and coats the circuit board blank with liquid polymer. The application and doctor rolls cannot be seen in this view. The roller coater is then retracted and the photo tool assembly 37 lowers into position. Member 38 guides the photo tool on bearing way 39. Chains 40 are attached to side brackets 49 and raise and lower the photo tool assembly. The photo tool lowers until adjustable pins 44 contact the upper surface of platen 61. In the fully-activated position, the photo tool assembly is supported by these adjustable pins 44. By adjusting these pins, the air gap between the photo tool and the liquid polymer can be changed. When the photo tool assembly is in place, actinic light source 27 is activated. Upon the light source being extinguished, the photo tool assembly is raised and the conveyor rollers 23 and associated belts 23(a) are activated. Motor 47 and associated belt 47(a) provide the motive force to rollers 23. At the time that the photo tool is being raised to its storage position, conveyor bracket 45 is raised by solenoids 46. Simultaneously, motor 47 and conveyor rollers 23 and the associated belts are activated so that the circuit board can be lifted off platen 61 and conveyed from the equipment to the next work station.

As discussed, it is preferred to operate this equipment in an automatic mode. Therefore, after turning on the master switch an operator, after inserting the film bearing the circuit design in the photo tool assembly, will position the circuit board blank on the vacuum platen and draw a vacuum on the platen to secure the circuit board blank. When the vacuum on the platen reaches a pre-set level, the liquid polymer roller coater automatically comes forward, and reverse coats the circuit board blank. The roller coater assembly then fully retracts. When the roller coater is in its stored position, the photo tool assembly lowers to within the pre-set air gap distance from the coated board. When the photo tool is in position, the light source is automatically activated for the pre-set time. The light source is then automatically extinguished and the photo tool assembly elevator mechanism raises the photo tool upwardly about 12 inches to its stored position. After the photo tool assembly has been raised a distance of about 2 inches, the conveyor mechanism in the area of the platen is raised about 0.5 to 1 inch to contact the underside of the imaged board and the entire conveyor is simultaneously switched on to move the imaged circuit board to the next work station. The equipment is then ready to repeat the roller coating and imaging cycle.

Figures 11, 11A:
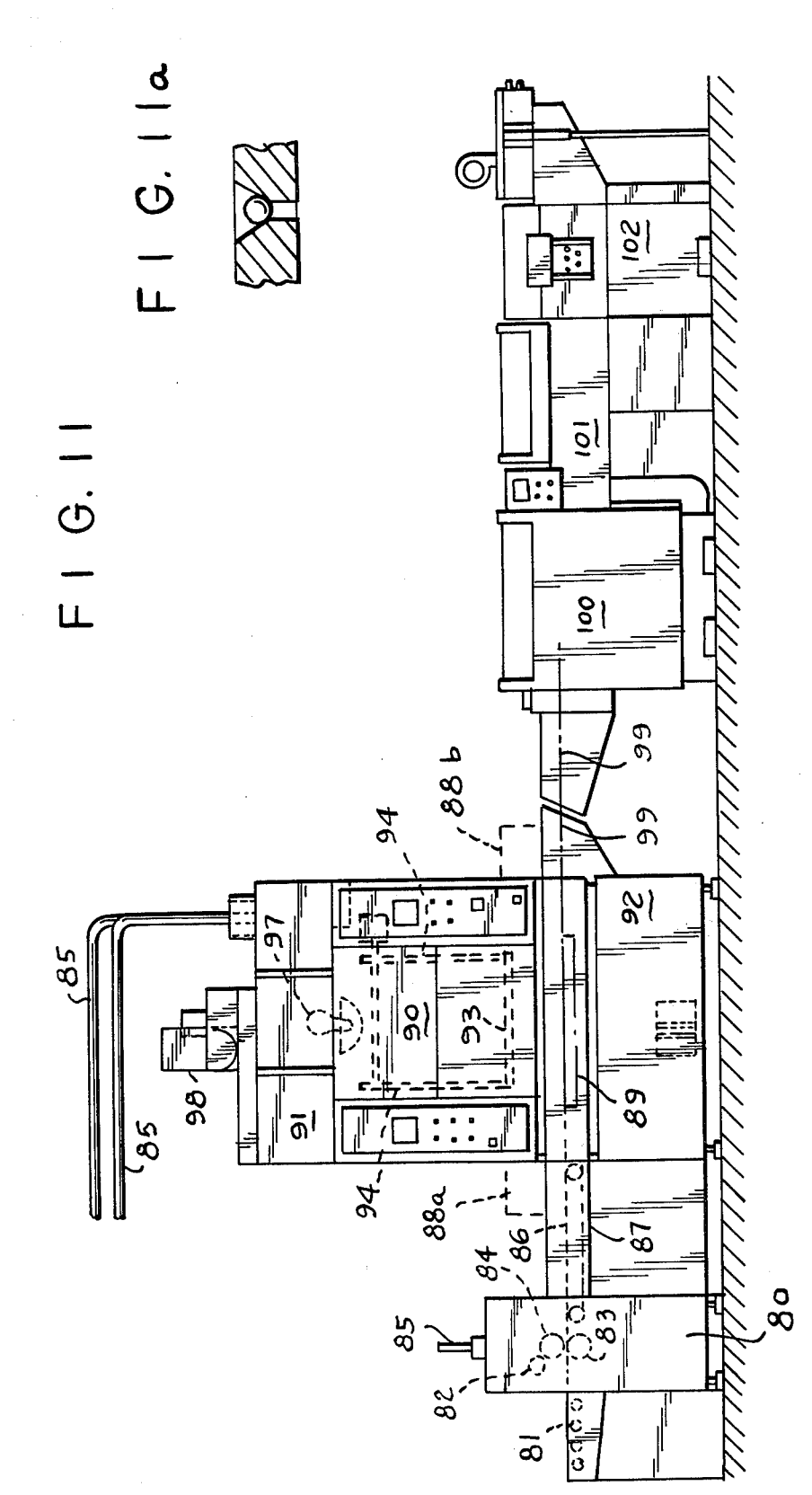

FIG. 11 illustrates the multi-station embodiment of the apparatus to practice the foregoing processes. While in the single station embodiment of FIGS. 9 and 10, the coating of the circuit board and its subsequent exposure is conducted at the same location; in the multi-station embodiment these steps are conducted at separate locations. The prime advantage of the multi-station embodiment over the single station embodiment is that daily production can be doubled. This is the result of being able to simultaneously coat one board with liquid polymer while another board is being exposed to the non-coherent collimated light.

In more detail, 80 is the circuit board liquid polymer coating station. The same type of retractable coater as in the single station apparatus of FIGS. 9 and 10 can be used. However, a coater where the coating rolls are stationary and the circuit board to be coated passes through the rolls is preferred. This is the case since the board can be continuously moved through to the non-coherent collimated light exposure section. Suitable coaters are commercially available from, for instance, the Union Tool Company. The coater which is illustrated is of the preferred type.

The coater consists of imput conveyor 81 which feeds the board into rolls 83 and 84. Roller 83 is a supporting roller, while roller 84 is the coating roller. Roller 82 is the nip roller. The supply of liquid polymer is maintained in the nip between rollers 82 and 84. After passing through these rollers and being coated, the board passes onto conveyor 86, which is fully enclosed. This enclosure consists of a sheet metal enclosure or optionally can have one or more sides of a transparent plastic. Conveyor 86 transports the coated board into exposure section 90. Immediately prior to the exposure section the board can be pre-exposed to a low level of light to partially polymerize the coating. This would be using low level, non-collimated light radiation, such as by use of fluorescent lights having an output in the UV visible range. This pre-exposure section 88(a) is shown in broken-line outline since it is an optional feature.

Conveyor 86 delivers the board onto platen 89 which is the same as the platen in the single station apparatus. That is, a conveyor moves the board into position over the platen and it is then retracted downwardly with the platen then supporting the board. Guide and registration pins are used to locate the board on the platen until the vacuum is drawn to secure the board onto the platen. However, rather than using guide and registration pins, various other equivalent mechanical techniques can be used.

When the board is in place, the photo tool 93 lowers into place via guideways and elevator mechanism 94. This photo tool is the same as that of the single station apparatus and is more fully described in FIG. 12. When the photo tool is in place and in registration with the board, the non-coherent collimated light source 97 is activated. This light source is the same as in the single station apparatus. It can be located in the upper part 91 of this section of the apparatus, or in the lower area 92 with mirrors located in the upper section to change the direction of the light so that after it passes upwardly it can, via multiple reflections, be passed downwardly through the photo tool. Regardless of the arrangement, this light source must have the characteristics as previously set forth, and discussed in detail with reference to FIG. 8. Fan and vent system 98 withdraws fumes and heat from the apparatus.

The lower region 92 will also contain the various utilities for the apparatus such as a transformer, vacuum pump, electric motors, valves, switches, and the like. These are arranged as space permits in this area.

After a board is exposed the photo tool retracts upwardly, the vacuum which holds the board onto the platen ceases, the platen conveyor moves upwardly from its rest position in the platen and moves the exposed board onto exit conveyor 99 which removes the board from the apparatus. Section 88(b) which is outlined by dashed lines, designates an optional post-cure option. That is, there can be a low intensity, non-collimated light source in the area which would further polymerize the liquid polymer on the board. Conveyor 99 delivers the board to the circuit board finishing line. This consists of apparatus 100 to remove the polymer which was not exposed to the collimated light. Typically, this is accomplished using an alkaline wash solution. The board can then be etched in section 101 to remove exposed metal, and in section 102 the liquid polymer which was polymerized by exposure to the collimated light is removed using a strong alkaline solution. These latter three sections which can be considered a developer line can consist of commercially available units from Chemcut Corporation. It should be noted that the board may not proceed through the full developer line, may be removed for some intermediate processing and then placed back in the developer line, or removed for some other form of processing.

Figure 12:
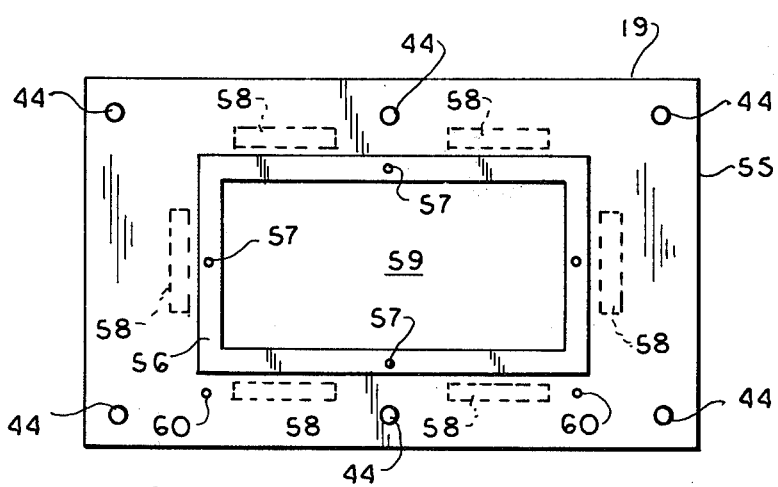
FIG. 12 is a planar view of the photo tool surface which is in air gap relationship with the circuit board blank during imaging.

FIG. 12 shows the lower surface of the photo tool assembly which is in close air gap relationship with the liquid polymer coating during imaging. Assembly 55, which is a metal such as aluminum, has inner area 59 where the photo tool is placed. Around this opening is vacuum channel 56. Openings 57 connect to tubing 31 on the upper surface. In this view, there are shown six adjusting pins 44. Items 58 are magnets which are embedded in the surface. These magnets will hold a metal frame which in addition can be used to hold the photo tool (film or plate) in position. There may optionally be a set of registration pins 60 for aligning the photo tool on the assembly. Such registration pins will pass through small holes in the photo tool. In use, the operator places the photo tool on the assembly and places thin steel strips in the area of the embedded magnets, whereby the photo tool is sandwiched between the surface and the strips. The vacuum system is then activated and the photo tool further secured in place. The pins 44 are adjusted to provide the proper air gap between the polymer coated blank and the photo tool. The photo tool assembly is then ready for use.

Figure 13:
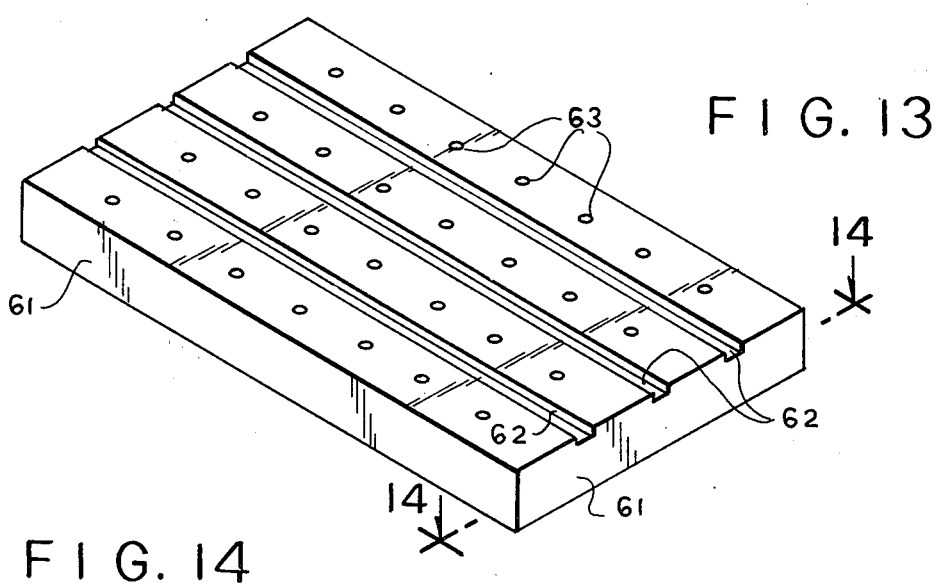
FIG. 13 is a perspective view of the platen assembly which holds the circuit board blank in position.
Figure 14:
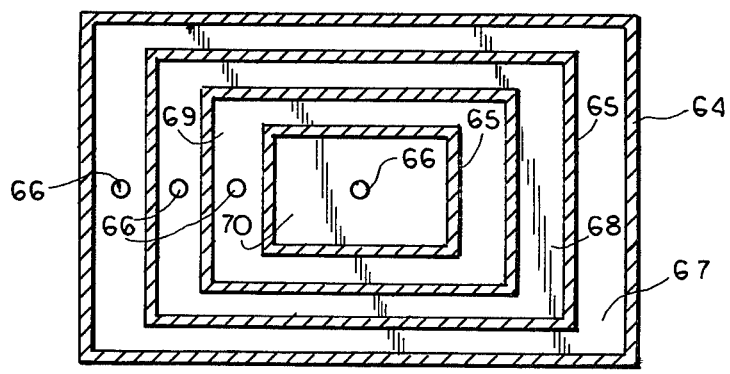
FIG. 14 is a sectional view of the platen assembly of FIG. 13 along line 14—14.

FIGS. 13 and 14 are views of the multi-chamber vacuum platen embodiment. FIG. 13 is a perspective view of the platen. In this view, the multi-chamber platen has the same appearance as the single chamber platen 11. In the single chamber platen of FIG. 4, a sealing plate fits onto shoulder 11(a) to form the vacuum chamber with vacuum line 30 attaching to this sealing plate. It also has the same channels 62 where the conveyor belts are located when not in use. And, further, both platens have a series of holds which communicate from the upper surface through to the inner chamber. In the single chamber platen these are designated 14, while in the multi-chambered platen they are designated 63. FIG. 14 is a section through the multi-chamber platen. The side walls 64 also form part of the outter chamber 67. Inner walls 65 form the walls of chambers 68, 69, and 70. Openings are passed through the lower surface and are connected to a vacuum manifold. The vacuum manifold and inter-connecting tubing is shown in FIG. 10. As discussed above, this multi-chamber platen assembly is more efficient when various sized circuit boards are to be produced. That is, for a small board, a vacuum would be drawn only on chamber 70, while for the largest boards a vacuum would be drawn on all of the chambers in order to better hold the circuit board blank in place.

In place of the multi-chamber vacuum platen there can be used a platen where the holes in the upper position can each be selectively opened or closed. One technique is to use holes having an offset configuration as shown in FIG. 11(a). The hole is offset and has a ball closure. When the platen is aluminum or a similar material, magnetic balls (attracted to a magnet) can be placed selectively in the holes to block the holes while a vacuum is drawn. Then to remove the balls, it is only necessary to move a magnet over the platen. If the platen is of a magnetic material, magnetic or other shot can be used with removal accomplished by an overpressure of air within the platen. This would blow the balls out of the holes.

Any liquid polymer composition which is curable to a solid using non-coherent collimated light and strippable in liquid systems can be used in the present processes. Suitable liquid polymer compositions which can be used are those set forth in U.S. Pat. Nos. 3,660,088 and 3,753,720. However, a preferred polymer is an acrylate having terminal unsaturation on one end of the polymer molecule and a terminal carboxyl group on the other end of the polymer molecule. The terminal unsaturation is curable by free radical polymerization using non-coherent collimated light, while the terminal carboxyl group provides for strippability of the cured polymer using concentrated alkaline solutions. A polymer having these characteristics and useful in the present processes is one having the following formula:

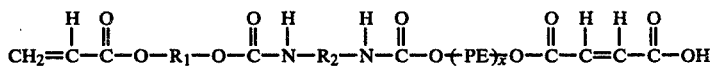

wherein $R_1$ is an alkyl group of from 1 to 6 carbon atoms, $R_2$ is the organic moeity of a diisocyanate and is an alicyclic, aryl, alkyl or arylalkyl group, and $(PE)_X$ is a polyester or polyether extending chain unit where X is an integer of from 2 to 50.

This polymer can be used alone or in conjunction with a viscosity modifier such as a carboxy terminated hydroxyethyl methacrylate having the formula:

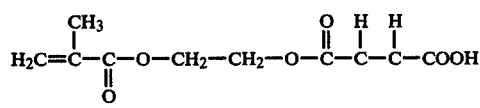

By adding varying amounts of the carboxy terminated hydroxyethyle methacrylate the viscosity of the liquid polymer composition can be changed. Other viscosity modifers can also be used. Also, useful in the liquid polymer composition is a photosensitizer such as, but not limited to, benzophenone, acetophenone, acenaphthenequinone, o-methyoxybenzophenone, dibenzosuberone, anthraquinone, hexanophenone, or 2,2-dimethoxy-2-phenyl aceto phenone. These substances enhance free radical generation and, thus speed the curing process. Other photosensitizers can be used.

These are the prime additives in the preferred liquid polymer composition. However, these compositions can also contain an epoxy acrylate, a multifunctional acrylate such as hexanediol diacylate, a multifunctional thiol such as pentaerythritol-tetrakis-($\beta$mercaptopropionate) and a phenolic stabiizer such as hydroquinone-mono-methyl ether or trihydroxy benzene. These additives stabilize the composition and also provide means for bridging the polymerized carboxy terminated acrylate to itself and also to the carboxy terminated hydroxyethyl methacrylate. Bridging provides for a harder cured polymer, and one which generally has higher thermal stability. For instance, when solder masks are to be made a bridging agent is used so that the polymer could better withstand the 400° or 500° F. temperature of tin-lead solder sprays.

This disclosure has been directed primarily to copper clad circuit board since they are presently the predominent printed circuit board presently commercially made. However, the processes are operable with other metal claddings and, further, would be operable with non-metallic conductive coatings. Therefore, wherever metal cladding is used, it is understood to include equivalent claddings.

This disclosure is directed to the use of non-coherent collimated light. A light having the specifications set forth herein has been developed for this present use by the Optical Radiation Company. A laser light beam is a coherent collimated light beam and cannot be used in place of the non-coherent collimated light was to be used, the laser beam would, via a computer system, have to be set to scan the design of the desired circuit. Such a laser system would be much more expensive than the non-coherent collimated light and photo tool arrangements discussed in detail in this application, and would require a longer duration in the exposure section leading to a loss of production. Also, a laser system would not meet the image deviation factor of not more than 0.5 mil.

The following examples disclose the invention in more detail.

EXAMPLE 1

This example sets forth a process for making one of the preferred liquid polymer composition.

A resin kettle is fitted with a stirrer, thermometer, drying tube and an addition funnel. (185 g of toluene diisocyanate), 0.63 g of hydroquinone monomethyl ether (MEHQ); 5.8 g of triphenyl-phosphite and 0.15 g of dibutyl-tin dilaurate are added to this kettle. Upon heating the mixture to 30°–35° C., there is added dropwise 189 g of hydroxypropyl acrylate, allowing the mixture to exotherm to 65° C. The temperature is maintained between 60°–65° C. for 1½ hours at which time substantially all of the hydroxy groups are consumed, and the NCO content reaches 1.77±0.1 meq/g as determined by titration with dibutylamine. Thereafter, 785 g of melted poly (diethyleneglycol adipate) with a molecular weight of 1000 is added along with 0.15 g of dibutyl-tin dilaurate catalyst. The reaction mixture is held at 65°–70° C. for approximately 6 hours until the isocyanate groups are consumed.

385 g of hydroxyethyl methacrylate and 0.42 g of hydroquinone are then added to this mixture. When the reaction mixture has become uniform and the temperature has dropped to below 65° C., 248 g of solid maleic anhydride and 8 g of dibutyltin dilaurate are added. Slowly (over about an hour) the reaction mixture is heated up to 55° C. to dissolve the maleic anhydride. The heating is continued and held at 75°–80° C. for approximately 6 hours until the maleic anhydride is completely reacted, as indicated by the absence of 1845 and 1975 cm$^{-1}$ peaks in an IR spectrograph. The final product thus obtained is a viscous liquid having viscosity of 5700 cps at 25° C. and acid group contents of 1.4 meq/a.

The prepolymer has the following composition:

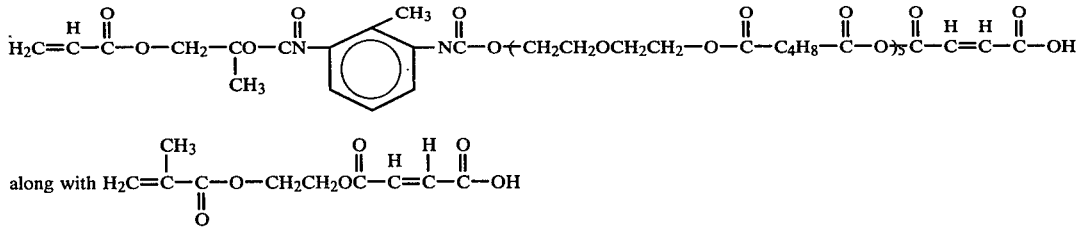

metal claddings and, further, would be operable with non-metallic conductive coatings. Therefore, wherever metal cladding is used, it is understood to include equivalent claddings.

EXAMPLE 2

The following composition is prepared from the resin product of Example 1 and is used in etch resist processing to make a printed circuit board:

| Component | Wt. % |
|---|---|
| The resin product of Example 1 | 79.93 |
| Epoxy acrylate (Epocryl 370) | 6.93 |
| Irgacure 551 | 0.92 |
| Benzophenone | 2.76 |
| Hydroquinone Mono-methyl ether | 0.046 |
| Pyrogallol | 0.023 |
| Leveling agent (Modaflow) | 2.30 |
| Chromophtal Blue (Ciba-Geigy) | 0.64 |
| Pentaerythritol tetra-kis- ($\beta$ - Mercaptopropionate) | 6.46 |

This composition has a Brookfield viscosity of 3,450 centipoises at 24° C.

A copper clad-epoxy fiberglass printed circuit board blank was cleaned by wet scrubbing with pumice using a Scotch Brite pad to remove corrosion and foreign material. The blank was then coated with the above composition to about 2.5 mil for 60 seconds through a photographic negative with a 25 mil air gap to the iquid coating on the board using a medium pressure mercury vapor lamp at a distance where the radiation intensity is about 25 mil-watts/cm$^2$. The exposed board is then spray-washed using a 5% sodium carbonate solution at room temperature for 10 seconds followed by water-rinsing and air drying leaving the cured photoresist as an image with high fidelity and resolution.

The washed board with the circuit pattern is then subject to hydrochloride acid-cupric chloride etching for 60 seconds at 52° C. to dissolve the copper in the uncoated areas. The cured polymer resist remains intact and provides good protection of the copper against the etchant. The cured polymer is then stripped using a 5% solution of sodium hydroxide at 55° C. About 30 seconds is required for stripping. The copper remaining on the board is found to have excellent detail and integrity. The circuit board lines are well shaped with sharp edges and have sidewalls which are essentially perpendicular to the substrate. On continuity and resistance testing, it is found that there are no short circuits and the resistance of similar circuit is essentially constant. Also, none of the liquid polymer entered any of the holes through the board.

EXAMPLE 3

This example illustrates making plate resists using the liquid polymer of Example 2. A circuit board blank (copper cladding of 1 ounce/sq. ft.) is then coated with the liquid polymer composition used in Example 2 by reverse coating. The coating thickness was nominally 1.9 mils. An Optical Radiation Company collimated mercury-zenon light was used as the energy source. The photo tool spacing pins were set to produce an air gap of about 30 mils (the photo tool was opaque areas in the same design as the desired circuit). The liquid polymer was exposed to the mercury-zenon source for 30 seconds. The board was then transported to a Chemcut spray washer where it was contacted with sodium carbonate at a pH of 10.5 for 10 seconds.

The exposed copper is then electroplated with tin-lead and the cured polymer is removed in a spray bath using a 5% sodium hydroxide solution at 130°–140° F. Stripping is complete in 30 seconds and the board is water rinsed. The exposed copper cladding is then removed by etching with a 3 N hydrochloric acidcupric chloride solution at 52° C. Etching is complete in 60 seconds and the board is then water rinsed. The circuit had high resolution and no short circuits.

EXAMPLE 4

This example illustrates making solder masks using the liquid polymer of Example 2.

A finished copper printed circuit board was secured onto a platen and a roller coater by reverse roller coating a continuous layer of the liquid polymer composition of Example 2 onto the circuit board. The coating was about 1.5 mils thick on the circuit, and about 4 to 5 mils thick in the none circuit bearing areas. A photo tool which is transparent, except for the circuit areas where solder is to be deposited, is placed in exact registration with the circuit board. The air gap used was 20 mils. An Optical Radiation Company mercury-zenon collimated light source was used to cure the polymer. The light was extinguished after 60 seconds and the board spray-washed with aqueous sodium carbonate solution at 10.5 pH. Spray washing was continued for 30 seconds. The board was removed and dried. The circuit board was then placed in a wave soldering apparatus where solder was applied to the exposed copper area. There was no damage to the cured polymer due to contact with molten solder. The cured polymer was left on the circuit board as a protective layer.

EXAMPLE 5

The procedure of Example 2 was repeated but using as a photo tool a circuit design where the circuit lines are to be 6 mils in width and with 6 mil spacing between circuit lines. The photo tool was a polyester film having a series of 6 mil wide opaque areas spaced apart by 6 mil wide transparent areas. An Optical Radiation Company collimated mercury-zenon light source was used for imaging. The other steps were the same as in Example 2. The resulting circuit board had well defined copper circuit lines which had side walls perpendicular to the board. None of the circuit lines had a short circuit. The circuit lines were nominally 6 mils wide with the spacings also nominally 6 mils wide.

With regard to the preferred class of polymers which can be used herein, U.S. Pat. application Ser. No. 225,809, filed Jan. 16, 1981, is incorporated herein by reference.

EXAMPLE 6

The following example illustrates the typical operation of the apparatus of FIGS. 9 and 10.

A commonly used blank board for testing is a 62 mil. laminate, 18 inches by 24 inches, with 1 ounce of copper on each side. There are no circuit holes in the board, but there are two 0.25 inch registration holes in the lower corners. The registration pins are manually activated and the board is placed on the platen with the registration pins passing through the registration holes. The door is then closed and a knee switch activated. The machine then proceeds through the following automatic cycle:

(1) a vacuum is drawn on the platen which then holds the board in place and the registration pins move downward into the platen, (2) the roller coater moves forward off the surface of the board and while moving rearwardly places a liquid polymer coating of nominally 1.5 to 1.8 mils on the board, (3) upon the roller coater fully retracting the elevator holding the photo tool (design of circuit closest to coated board) lowers to a 10 mil air gap with the coated board (2 registration pins on the photo tool fitting into grooves in the platen to confirm registration of the photo tool with the coated board), (4) the light source is then automatically activated and exposes the board to light energy through the photo tool for approximately 18 seconds which is the time to contact the board to 324 mille joules/sq. cm. of light energy, (5) the light source is then automatically extinguished, the photo tool raised, the vacuum in the platen broken, and the platen conveyor raised and activated and the exposed board conveyed out of the apparatus to the developer section.

The subsequent operations are carried out in auxiliary units of equipment. That is, the board is conveyed into a developer to remove uncured liquid polymer where a 1 percent aqueous sodium carbonate solution at 95° F. is sprayed onto the board for approximately 36 seconds. The board is then water rinsed and air dried. After air drying the board is post exposed to 11–12 mille watts/sq. cm. light energy for about 35 seconds. This post exposure further cures the polymer left on the board. There is now solid polymer covering the copper where the desired circuit exits. Typically, however, a circuit is placed on each side of a board of this kind. Consequently, in normal operation after the post exposure step, the board is placed back into the coating and exposing apparatus on its reverse side and steps (1) through (5) repeated. The same or a different circuit design can be used in the photo tool and placed on the reverse side of the board. The board then again goes through the developer to remove liquid polymer, is water rinsed, air dried and post exposed. At this point the board then goes to etching where the exposed copper on each side is removed. Etching is carried out as in Example 2. The polymerized material covering the circuit lines is then removed by means of a spray bath containing a 5 percent aqueous sodium hydroxide solution at about 130° F. The resulting board has well-defined copper circuit lines.

EXAMPLE 7

The following example illustrates the typical operation of the apparatus of FIG. 11.

The commonly used blank board is a 62 mil., 18 by 24 inches, laminate with 1 ounce of copper on each side. There are no circuit holes in the board, but there are two registration holes. The coater is a Union Tool Company roller coater with grooved rolls having 36 threads per inch. The board is placed on the conveyor which feeds the board into the coater. The board is coated and on exit from the coating rolls activates a conveyor for moving the board into the imaging section. Also, when the conveyor is activated a pre-exposure lamp is activated. The board passes under this lamp which has an intensity of 3 to 3.5 mille watts/sq. cm. and is exposed to this radiation for about 2 to 3 seconds. The board then contacts a switch which activates the platen conveyor and raises three guide pins. The platen conveyor moves the board and nestles it against the guide pins. The platen conveyor then lowers into the platen, thereby placing the board on the platen. Pusher arms and a hold down bar are then activated to hold the board nestled against the guide pins. The hold down bar rests on an uncoated edge of the board and holds the board while tapered registration pins rise up from the platen and enter the registration holes in the board. The vacuum in the platen is then activated and the hold down bar and registration pins retract. The following steps are the same as for the apparatus of FIGS. 8 and 9. The photo tool carrying the circuit design then lowers to a 10 mil air gap with the coated surface of the circuit board. Two registration pins on the photo tool fit into two registration grooves on the platen. The circuit design on the photo tool is now in registration with the circuit board. The lamp is automatically activated for about 18 seconds to about 324 mille watts/sq. cm. of light energy. The light source is then automatically extinguished, the photo tool raised, the vacuum in the platen broken, and the platen conveyor raised. The platen conveyor then moves the exposed board out of the apparatus and to the developer section. The developer section and the subsequent processing steps are the same as for the apparatus of FIGS. 8 and 9.

The foregoing examples are meant to describe the various preferred modes of practicing the present invention. The modification of one or more steps and/or the addition of one or more steps is quite possible. For instance, it has been found in the course of the work that a post development contacting of the board with polymerizable radiation is desirable. This functions to harden the polymer and decreases the likelihood of its attack in the etching bath. It is also desirable in making solder masks since the more highly polymerized material is less susceptible to thermal degradation during the application of solder to the exposed copper. However, in many operations post exposure will provide little benefit and those instances it will not be used.

It has also been found that when solder is to be coated onto copper from which liquid polymer has been removed, it may be desirable to contact the board with an oxidizing solution such as an aqueous solution containing sodium perchlorate, sodium hypochlorite, sodium nitrite, or the like. Such a procedure provides a better surface for coating with solder. Typically, these solutions will contain about 2 to 10 percent by weight of oxidizing agent. These modifications to the basic process are considered to be within the scope of the basic process as described in this specification.

We claim:

1. A process for making a resist pattern on circuit boards comprising:
   (a) providing a circuit board substrate;
   (b) coating at least a portion of said substrate with a liquid polymer composition curable to a solid by means of non-coherent collimated light radiation;
   (c) projecting a pattern of substantially collimated non-coherent light radiation patterned by patterning means out of contact with said liquid polymer coating;
   (d) exposing said coating of liquid polymer composition to said projected pattern of substantially collimated non-coherent light radiation and curing the polymer composition to a solid polymer in said pattern of substantially collimated non-coherent light and maintaining said liquid polymer a substantially uncured liquid polymer outside of said pattern of substantially collimated non-coherent light; and
   (e) removing said substantially uncured liquid polymer leaving said solid polymer in said pattern on said circuit board substrate.

2. A process for making a resist pattern on circuit boards as in claim 1 wherein the patterning means is a photo tool and said photo tool having substantially vertical edges such that the angle of the substantially vertical edges of the photoresist is within about ±3 degrees of the vertical.

3. A process for making a resist pattern on circuit boards as in claim 1 wherein said non-coherent substantially collimated light radiation has a half angle of not more than about 3 degrees as measured by the angles of the substantially vertical edges of the photoresist.

4. A process for making a resist pattern on circuit boards as in claim 1 wherein said coating procedure (b) is carried out by roller coating.

5. A process for making a resist pattern on circuit boards as in claim 3 wherein procedure (c) is carried out by placing a photo tool out of contact with but in close relationship with said liquid polymer coating and contacting said photo tool with non-coherent substantially collimated light radiation, passing a portion of said non-coherent substantially collimated light radiation through said photo tool which portion of said non-coherent substantially collimated light passing through said photo tool forms said projected pattern of non-coherent substantially collimated light radiation.

6. A process for making a resist pattern on circuit boards as in claim 5 wherein the image dimension deviation factor is more than about 0.5 mil and an air gap is maintained between the photo tool and the liquid polymer coated surface of about 5 to 500 mils.

7. A process for making a resist pattern on circuit boards as in claim 1 wherein said coating (b) is in a thickness of about 0.1 to 10 mils.

8. The process of making a resist pattern on circuit boards as in claim 6 wherein said coating (b) is carried out in reverse roller coating in a thickness of about 0.5 to 5 mils, said half angle is not more than about 1.5 degrees from the vertical and said image deviation is not more than about 0.25 mil.

9. A process for making a resist pattern on a printed circuit board substrate comprising:
   (a) providing a circuit board substrate;
   (b) coating at least a portion of said substrate with a liquid polymer composition curable by means of non-coherent collimated light radiation;
   (c) forming an air gap by placing a photo tool in close relationship with said liquid polymer coated surface;

(d) contacting said photo tool with non-coherent collimated light radiation having a half angle of not more than about 3 degrees from the vertical and an image dimension deviation factor of no more than about 0.5 mil, whereby said light selectively passes through parts of said photo tool, contact said liquid polymer coated surface, and causes said liquid polymer to cure to a solid polymer where contacted by said light;

(e) discontinuing the application of said light leaving a solid cured polymer on at least portions of said circuit board substrate; and (f) removing substantially uncured liquid polymer leaving said solid cured polymer in said resist pattern on said circuit board substrate.

10. A process for making a resist pattern on a printed circuit board substrate as in claim 9 wherein the air gap between the photo tool and the liquid polymer coated surface, while contacting the photo tool with said light radiation is maintained at about 5 to 500 mils.

11. A process for making a resist pattern on a printed circuit board substrate as in claim 10 wherein said circuit board substrate has a metal cladding on at least one side and said liquid polymer which has remained liquid after the step in which said photo tool has been contacted with said light radiation is removed by contacting with an aqueous solution in which said polymer is at least partially soluble thereby partly exposing said metal cladding.

12. A process for making a resist pattern on a printed circuit board substrate as in claim 9 wherein said liquid polymer composition is coated onto said substrate in a thickness of about 0.1 to 10 mils by roller coating.

13. A process for making a resist pattern on a printed circuit board substrate as in claim 12 wherein said roller coating is reverse roller coating with said coating having a thickness of from about 0.5 to 5 mils.

14. A process for making a resist pattern on a printed circuit board substrate as in claim 12 wherein said non-coherent collimated light, radiation has a half angle of not more than about 1.5 degrees from the vertical and an image deviation of no more than about 0.25 mil.

15. A process for making printed circuit boards comprising:

(a) providing a circuit board substrate;

(b) coating at least a portion of said substrate with a liquid polymer composition curable by means of non-coherent collimated light radiation;

(c) forming an air gap by placing a photo tool in close relationship with said liquid polymer coated surface;

(d) contacting said photo tool with non-coherent collimated light radiation having a half angle of not more than about 3 degrees from the vertical and an image dimension deviation factor of no more than about 0.5 mil, whereby said light selectively passed through parts of said photo tool, contacts said liquid polymer coated surface, and causes said liquid polymer to cure to a solid polymer where contacted by said light;

(e) discontinuing the application of said light radiation and removing the uncured liquid polymer to leave a solid cured polymer on at least portions thereof;

(f) treating the areas not covered by said cured liquid polymer to produce a defined circuit; and (g) removing the cured liquid polymer from said substrate.

16. A process for making printed circuit boards as in claim 15, wherein the air gap between the photo tool and the liquid polymer coated surface, while coating the photo tool with said light radiation, is maintained at about 5 to 500 mils.

17. A process for making printed circuit boards as in claim 15, wherein said circuit board substrate has a metal cladding on at least one side; said liquid polymer which has remained liquid after the step in which said photo tool has been contacted with said light radiation is removed by contact with an aqueous solution in which the liquid polymer is at least partially soluble, and said cured polymer is removed by contact with an aqueous solution containing cations derived from a strong base.

18. A process for making printed circuit boards as in claim 17, wherein said cations derived from a strong base are selected from the group consisting of sodium, potassium and ammonium cations.

19. A process for making printed circuit boards as in claim 15, wherein said liquid polymer composition is coated onto said substrate in a thickness of about 0.1 to 10 mils by roller coating.

20. A process for making printed circuit boards as in claim 19, wherein said roller coating is reverse roller coating with said coating having a thickness of from about 0.5 to 5 mils.

21. A process for making printed circuit boards as in claim 19, wherein said non-coherent collimated light radiation has a half angle of not more than about 1.5 degrees from the vertical and an image deviation of no more than about 0.25 mil.

22. A process for making printed circuit boards as in claim 19, wherein said liquid polymer consists primarily of a urethane molecule having terminal unsaturation at one end and a terminal carboxy group on the other end.

23. A process for making printed circuit boards as in claim 22, wherein said liquid polymer consists primarily of:

$$CH_2=\underset{\underset{H}{|}}{C}-\underset{\underset{O}{\|}}{C}-O-R_1-O-\underset{\underset{O}{\|}}{C}-\underset{\underset{H}{|}}{N}-R_2-\underset{\underset{H}{|}}{N}-\underset{\underset{O}{\|}}{C}-O(PE)_{\overline{x}}O-\underset{\underset{O}{\|}}{C}-C=C-\underset{\underset{O}{\|}}{C}-OH$$

wherein $R_1$ is an alkyl group of from 1 to 6 carbon atoms, $R_2$ is the organic moeity of a diisocyanate and is an alicyclic, aryl, alkyl or arylalkyl group, and $(PE)_x$ is a polyester or polyether extending chain unit where X is an integer of from 2 to 50.

24. A process for making printed circuit boards as in claim 23, wherein said liquid polymer composition contains a carboxy terminated methacrylate and a photosensitizer.

25. A process for making printed circuit boards as in claim 24, wherein said liquid polymer composition contains a cross-linking agent containing terminal unsaturated groups.

26. A process for making printed circuit boards as in claim 24, wherein said liquid polymer composition includes a cross-linking agent containing terminal thiol groups.

27. A process for making printed circuit boards comprising:
(a) providing a circuit board substrate;
(b) coating at least a portion of said substrate with a liquid polymer composition curable by means of non-coherent collimated light radiation;
(c) forming an air gap by placing a photo tool in close relationship with said liquid polymer coated surface;
(d) contacting said photo tool with said collimated light radiation having a half angle of not more than about 3 degrees from the vertical and an image dimension deviation factor of no more than about 0.5 mil, whereby said light radiation selectively passes through parts of said photo tool, contacts said liquid polymer coated surface, causes said liquid polymer to cure to a solid polymer where contacted with said light radiation;
(e) discontinuing the application of said light radiation and removing the uncured liquid polymer leaving a solid cured polymer on at least portions thereof;
(f) plating metals onto areas of said circuit board substrate from which said liquid polymer has been removed;
(g) removing the cured liquid polymer; and
(h) treating the areas not covered by said plated metal to produce a defined circuit.

28. A process for making printed circuit boards as in claim 27, wherein the air gap between the photo tool and the liquid polymer coated surface, while contacting the photo tool with said light radiation, is about 5 to 500 mils.

29. A process for making printed circuit boards as in claim 27, wherein said circuit board substrate has a metal cladding on at least one side, said liquid polymer which has remained liquid after the step in which said photo tool has been contacted with said light radiation is removed by contact with an aqueous solution in which said liquid polymer is at least partially soluble; and said cured polymer is removed by contact with an aqueous solution containing cations derived from a strong base.

30. A process for making printed circuit boards as in claim 29, wherein said cations derived from a strong base are selected from the group consisting of sodium, potassium, and ammonium ions.

31. A process for making printed circuit boards as in claim 27, wherein said liquid polymer composition is coated onto said circuit board substrate in a thickness of about 0.1 to 10 mils by roller coating.

32. A process for making printed circuit boards as in claim 31, wherein said roller coating is reverse roller coating with said coating having a thickness of from about 0.5 to 5 mils.

33. A process for making printed circuit boards as in claim 31, wherein said non-coherent collimated light radiation has a half angle of not more than about 1.5 degrees from the vertical and an image deviation of no more than about 0.25 mil.

34. A process for making printed circuit boards as in claim 31, wherein said liquid polymer consists primarily of a urethane molecule having terminal unsaturation at one end and a terminal carboxy group on the other end.

35. A process for making printed circuit boards as in claim 33, wherein said liquid polymer consists primarily of:

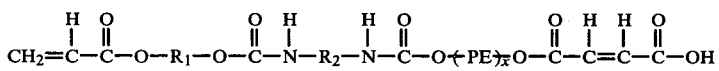

wherein $R_1$ is an alkyl group of from 1 to 6 carbon atoms, $R_2$ is the organic moeity of a diisocyanate and is an alicyclic, aryl, alkyl or arylalkyl group, and $(PE)_x$ is a polyester or polyether extending chain unit where X is an integer of from 2 to 50.

36. A process for making printed circuit boards as in claim 33, wherein said liquid polymer composition contains a carboxy terminated methacrylate and a photosensitizer.

37. A process for making printed circuit boards as in claim 36, wherein said liquid polymer composition contains a cross-linking agent containing terminal unsaturation.

38. A process for making printed circuit boards as in claim 36, wherein said liquid polymer composition contains a cross-linking agent containing terminal thiol groups.

* * * * *

Disclaimer 4,436,806.—*Francis J. Rendulic,* Sudbury; *Robert K. Trasavage,* Whitinsville, Mass.; and *Paul A. Boduch,* Lakewood, Colo. METHOD AND APPARATUS FOR MAKING PRINTED CIRCUIT BOARDS. Patent dated Mar. 13, 1984. Disclaimer filed Nov. 12, 1985, by the assignee, *W. R. Grace & Co.*

Hereby enters this disclaimer to all claims of said patent.
[*Official Gazette May 6, 1986.*]